United States Patent [19]
Ohtani et al.

[11] Patent Number: 5,326,746
[45] Date of Patent: Jul. 5, 1994

[54] FABRICATION METHOD OF SUPERCONDUCTIVE THIN FILM TRANSISTOR

[75] Inventors: Hisashi Ohtani; Akiharu Miyanaga, both of Kanagawa; Shunpei Yamazaki, Tokyo, all of Japan

[73] Assignee: Semiconductor Energy Laboratory Co., Ltd., Kanagawa, Japan

[21] Appl. No.: 856,673

[22] Filed: Mar. 24, 1992

[30] Foreign Application Priority Data

Mar. 27, 1991 [JP] Japan .................. 3-089541

[51] Int. Cl.⁵ .......... H01L 39/22; H01L 49/02; H01L 27/01; H01L 23/48
[52] U.S. Cl. .................. 505/330; 505/701; 505/833; 437/41; 437/42; 437/984
[58] Field of Search ............ 505/1, 701, 725; 437/21, 40; 427/63

[56] References Cited

U.S. PATENT DOCUMENTS

| 5,024,993 | 6/1991 | Kroger et al. ............ 505/701 |
| 5,064,809 | 11/1991 | Hed ............................ 505/1 |
| 5,138,401 | 8/1992 | Yamazaki ................. 505/701 |

FOREIGN PATENT DOCUMENTS 1-169949   7/1989   Japan .................. 505/701

Primary Examiner—Mary Wilczewski
Attorney, Agent, or Firm—Sixbey, Friedman, Leedom & Ferguson

[57] ABSTRACT

A planar type superconductive thin film transistor using oxide superconductive materials and utilizing a long distance proximity effect is obtained with a good reproducibility.

In order to obtain the planar type superconductive transistor utilizing the long distance proximity effect, an interlayer separating film that plays a similar role with resists is used together with conventional resists in high temperature annealing process.

8 Claims, 13 Drawing Sheets

5,326,746

FABRICATION METHOD OF SUPERCONDUCTIVE THIN FILM TRANSISTOR

BACKGROUND OF THE INVENTION

The present invention relates to a structure of a superconductive thin film field effect transistor and to a high yield and productive fabrication method of the same.

Conventionally, Nb-Ge metallic material (for example $Nb_3Ge$) is used as a superconductive material. Since these materials have relatively large coherent length, a Josephson device in which an insulator is pinched between superconductive materials can be fabricated relatively easily, and such devices as a transistor using proximity effect can be made. Superconductive materials using conventional metals also have an advantage in that, since they have no anisotropy in their structure, electronic devices can be fabricated without considering orientation and other related issues.

However, superconductive materials using these metallic materials have a low Tc (superconductive critical temperature is referred to simply as Tc hereinafter), such as 23 K. or less. In applying them to industrial uses, they would clearly be more useful if their Tc were above the temperature of liquid nitrogen (77 K.). To that end, it has been being strongly desired to build up electronic devices using oxide superconductive materials.

Nevertheless, electronic devices using oxide superconductive materials have not been constructed so far, mainly due to the following two reasons: First, high Tc superconductive materials have problems in that their coherent length is short and they have anisotropy in their crystal structure; and second, high temperature annealing is necessary in processing them. The former problem requires that the devices be processed precisely, and renders processing of the devices difficult. The latter problem causes diffusion of atoms in annealing and thereby adversely affects characteristics of the devices.

More recently, a phenomenon called a long distance proximity effect has been confirmed. When a non-superconductive material having a perovskite structure which is like a parent material of oxide superconductive materials is enclosed between a plurality of oxide superconductive materials, superconductive current flows even if the distance between the oxide superconductive materials is larger than that in the conventional proximity effect. The cause of this phenomenon remains unclear, though by using the long distant proximity effect, the problem of coherent length of the oxide superconductive materials may possibly be overcome, so that such electronic devices as transistors using the oxide superconductive materials may be fabricated. Presently, however, electronic devices using the long distance proximity effect have not been obtained.

Accordingly, it is an object of the present invention to establish a structure of and a process for fabricating such electronic devices, including superconductive transistors in particular, using the aforementioned long distance proximity effect.

It is obvious that it is desirable to use a mono-crystal thin film of an oxide superconductive material whose coherent length is long in the direction of ab plane; thus, a planar type structure using c-axis oriented film is naturally desirable. However, since a process for fabricating such an ideal structure has not been known, only laminated type electronic devices, whose coherent length is short and junctioned in the ab-axis direction, and incomplete planar-type electronic devices have been obtained.

Furthermore, in terms of the process for fabricating them, resists and others used in prior art semiconductor fabricating processes cannot sustain the film forming temperature of the oxide superconductive materials.

SUMMARY OF THE INVENTION

It is, accordingly, an object of the present invention to provide an electronic device having an ideal structure using such oxide superconductive materials. In the case of a transistor, this ideal structure takes the form of a superconductive transistor of a field effect type made using oxide superconductive materials, comprising: a lamination layer making up a channel formation area and composed of (1) a non-superconductor layer having a perovskite structure almost the same as that of the oxide superconductive material, and (2) a conductor layer which will become a gate electrode on an insulating substrate to control superconductive current that flows between a source and drain using an electric field applied to the gate electrode; source and drain areas made using a film of oxide superconductive material oriented in the c-axis direction to the substrate to provide a junction transverse to the channel forming area and a planar-type structure in the ab plane direction in which coherent length is long as a whole. It is needless to say that the superconductive transistor is a thin film transistor (hereinafter referred to as TFT) so that it may be part of a larger circuit.

In the aforementioned superconductive transistor, although any type of insulating substrate may be used, since a thin film composed of oxide superconductive material has to be epitaxially grown on it, it is desirable to use, for example, alumina, YSZ (yttrium stabilized zircon), magnesium oxide (MgO), zirconia, yttria, strontium titanate ($SrTiO_3$), glass, a non-superconductive material having the same main components with the oxide superconductive material, or a composite substrate on which the oxide superconductive thin film is formed on a metallic substrate. Moreover, although any type of oxide superconductive material may be used for forming the source and drain, since it is desirable to operate above the temperature of liquid nitrogen to achieve the purpose of the present invention, it is desirable to use an oxide superconductive material having a perovskite structure and which is composed of one of the following materials: $(A_{1-x}B_x)yCu_zO_w$, where $x=0.1$ to $1.0$, $y=2.0$ to $4.0$, $z=1.0$ to $4.0$ and $w=4.0$ to $10.0$, where A is composed of one or more elements selected from Y (yttrium), Gd (Gadolinium), Yb (ytterbium), Eu (europium) Tb (terbium) Dy (dysprosium), Ho (holmium), ER (erbium), Tm (thulium), Lu (lutetium), Sc (scandium) and other lanthanoids, and where B is composed of one or more elements selected from Ba (barium), Sr (strontium) and Ca (calcium). In order to realize the superconductive transistor having the aforementioned structure, a process which is totally different from prior art processes is required. The preferred process differs slightly depending on whether or not the substrate material has a light transmitting property. When the substrate is non-light-transmitting, the process for providing a source area, a drain area and a gate electrode comprises several steps. A lamination layer is formed on the non-light-transmitting insulating substrate, in an island shape, consisting of (1) a non-superconductor layer having a perovskite structure substantially the same as that of the oxide superconductive material which will be used to form a channel region, (2) an insulating film layer which will become a gate insulating film and (3) a conductor layer which will become the gate electrode. The sides of the conductor layer which will become the gate electrode part of the island-shaped laminated body are selectively etched. An interlayer insulating film is laminated to the structure. A positive resist is applied on the interlayer separating film, masking the upper part of the island-shaped lamination layer to sensitize the positive resist. The interlayer insulating film is left around the conductor layer by removing the sensitized positive resist and selectively etching the interlayer insulating film. A film is formed, composed of the oxide superconductive material which will become the source and drain areas. This superconducting film is removed outside of the area of the interlayer insulating film at the side of the conductor layer, together with the interlayer insulating film, by removing the interlayer separating film left at the sides of the conductor layer. The above process is characterized in that the non-superconductor layer having a perovskite structure substantially identical to the oxide superconductive material making up the channel formation region, and the layer of the conductor composed of silicon, doped with highly concentrated aluminum, chromium, molybdenum, silver, phosphorus, boron, or an alloy thereof, are laminated on an appropriate non-transmitting insulating substrate composed of, for example, alumina and YSZ (yttrium stabilized zircon) without patterning.

Although coating processes and patterning processes are repeated in complex steps to fabricate field effect superconductive transistors in the prior art processes, the structure of the present invention allows simplification of the process as compared to the prior art processes.

The non-superconductive layer having a perovskite structure almost the same as that of the oxide superconductive material used for the channel formation area is preferably a mono-crystal film formed epitaxially by sputtering, plasma CVD, thermal CVD, molecular beam epitaxy, etc.

When the mono-crystal superconductive film is formed, it is also very effective to align a plane composed of the B site ion and its surrounding O site ion in parallel to be ab plane of the superconductive material to make use of the long distance proximity effect.

The channel formation area and the gate electrode of the field effect superconductive transistor are made by forming the lamination layer including the non-superconductor perovskite-structured layer, and of the layer of the conductor which will become the gate electrode, into a desired shape using a first mask.

Laser patterning may be of course performed at this point using a laser to obtain the desired shape.

As the mask pattern for sensitizing the resist (the first mask in this case), a chromium or chromium oxide mask pattern is used.

The step of creating the conductor which forms the gate electrode by selectively etching the lamination layer formed into the island shape is the most important process in obtaining the desired structure of the present invention.

That is, a filler is placed in an etched part created by selectively etching around the gate electrode, and the filler prevents the gate electrode from contacting the oxide superconductive material when the oxide superconductive film is formed in the later process.

As the filler, a film mainly composed of, for example, carbon may be used. That is, after selectively etching around the gate electrode, a resist remaining above the gate electrode is removed and the film, for example mainly composed of carbon, is formed by sputtering, plasma CVD or thermal CVD. Then, when a positive resist is applied and an exposure is carried out through a mask, the resist can be left on the carbon film only in an area corresponding to the channel. Then, etching is carried out selectively using NF$_3$, or other appropriate etchants, to leave the carbon film filler around the layer which will become the gate electrode.

The filler is provided at the over-etched part around the gate electrode to remove the part of the oxide superconductive film formed outside of the filler when the filler is evaporated by heat annealing at 600° to 1000° C. or else is dissolved and removed through treatment with water or an organic solvent.

This method is called a lift-off method which is often used in patterning process in fabricating semiconductor devices.

As described above, the part of the film composed of the oxide superconductive material is removed, together with the filler around the gate electrode, and the film composed of the oxide superconductive material is divided into source and drain areas.

The planar type field effect superconductive transistor may be formed by sensitizing or non-sensitizing the positive or negative resist into a shape of element area using a second mask after the aforementioned processes, and by implementing so-called inter-element separating by a dry-etching process using the resist.

The example described above is applicable when the substrate is of a non-light-transmitting type. When the substrate has a light transmitting property, the process may be further simplified. When the substrate has a light transmitting property, the process for providing a source area, a drain area and a gate electrode comprises the steps of forming on the light transmitting insulating substrate an island-shaped lamination layer consisting of (1) a non-superconductor layer with a perovskite structure almost identical to that of an oxide superconductive material to be used for a channel formation area, (2) an insulating film layer which will become a gate insulating film and (3) a conductor layer which will become the gate electrode; selectively etching sides of the conductor layer which will become the gate electrode part of the island-shaped laminated body; laminating a film mainly composed of carbon to the structure as an interlayer separating film; applying a positive resist on the interlayer separating film; irradiating light from the back of the light transmitting insulating substrate to sensitize the positive resist; sensitizing the positive resist using the channel forming area of the lamination layer formed in the island shape as a mask; and removing the oxide superconductive film outside of the interlayer separating film on the side of the conductor layer, together with the interlayer separating film, by removing the interlayer separating film in the area.

The above process is characterized, similarly to the aforementioned example using the non-transmitting insulating substrate, in that the non-superconductor perovskite-structured layer, and a layer of the conductor composed of silicon doped with highly concentrated aluminum, chromium, molybdenum, silver, phosphorus, boron, or an alloy thereof, are laminated on an appropriate light transmitting insulating substrate composed of, for example, magnesium oxide (MgO) or strontium titanate (SiTiO$_3$), without patterning.

The non-superconductive layer with its perovskite structure almost the same as that of the oxide superconductive material used in the channel formation area is preferably a single crystal film formed epitaxially by sputtering, plasma CVD, thermal CVD, molecular beam epitaxy, etc.

When the single crystal superconductive film is formed, it is also effective to align a plane composed of the B site ions and their surrounding O site ions in parallel to the ab plane of the superconductive material to use the long distance proximity effect.

The channel formation area and the gate electrode of the field effect superconductive transistor are made by forming the lamination layer, including the non-superconductor layer having almost the same perovskite structure as that of the oxide superconductive material which will be used to make the channel formation area, and of the layer of the conductor which will become the gate electrode, into a desired shape using a first mask.

Laser patterning may be performed at this point, using a laser to obtain the desired shape.

As a mask pattern for sensitizing the resist (the first mask in this case), a chromium or chromium oxide mask pattern is used.

The step for creating the conductor which will become the gate electrode, performed by selectively etching the island-shaped lamination layer, is the most important step of the process in obtaining the structure of the present invention.

That is, a filler material is filled into the etched part created by selectively etching around the gate electrode. The filler prevents the gate electrode from contacting the oxide superconductive material when this material is formed in the later process.

As the filler, a film mainly composed of, for example, carbon and having a light transmitting property may be used.

That is, after selectively etching around the gate electrode, the resist remaining above the gate electrode is removed and the film mainly composed of carbon, for example, is formed on it by sputtering, plasma CVD or thermal CVD. Then, when a positive resist is applied and an exposure is carried out through the carbon film having the light transmitting property, from the back of the substrate, the resist can be left only in the channel area of the carbon film. The semiconductor layer which forms the channel forming area has not been etched when the layer of silver or other material which will become the gate electrode was selectively etched, and this layer masks light for the exposure (generally UV light less than 5000 A). Then etching is carried out selectively using NF$_3$ or other appropriate etchants, to leave the carbon film filler around the gate electrode layer.

The filler is provided at the over-etched part around the gate electrode to remove the oxide superconductive film formed outside of the filler at the same time when the filler is evaporated by heat annealing at 600° to 1000° C., or is dissolved and removed by treatment with water or an organic solvent.

This method is called a lift-off method as indicated previously.

As described above, the part of the film composed of the oxide superconductive material is removed, together with the filler around the gate electrode, and oxide superconductive film is divided into source and drain areas.

The planar type field effect superconductive transistor may be formed by sensitizing or non-sensitizing the positive or negative resist into a shape of an element area using the second mask after the aforementioned processes, and by implementing so-called inter-element separating by a dry-etching process using the resist. This process is used when a light transmitting substrate is used.

The most significant feature of the structure of the present invention is that mask alignment is necessary in fabricating TFTs only three times when a non-light-transmitting substrate is used, and only two times when a light transmitting substrate is used in the aforementioned processes.

Characteristics of the field effect superconductive transistor are effectively enhanced by selectively etching the perovskite-structured non-superconductor layer after the process for forming the filler around the etched gate electrode in the above processes.

The present invention prevents the problem of undesired creation of a resistance in the channel formation area when the part which forms the channel formation area is very large relative to the gate electrode part.

DETAILED DESCRIPTION OF PREFERRED EMBODIMENT

Figure 1A:
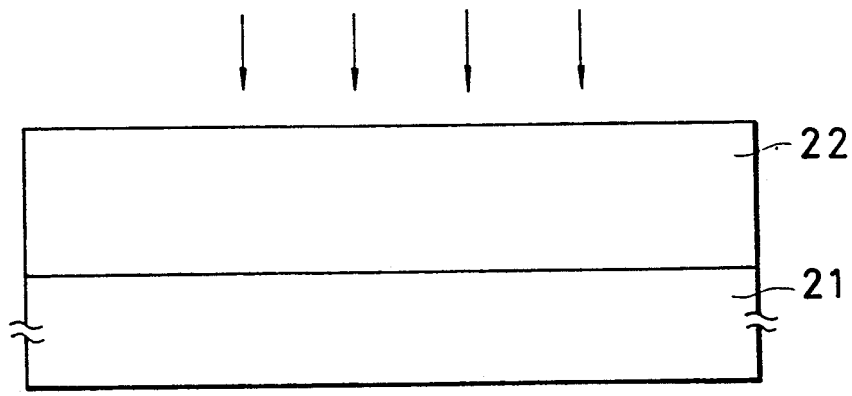
FIGS. 1(A) through (Q) illustrate an example of a method for fabricating STFT of the present invention using a light transmitting substrate.

Referring now to the drawings, a structure according to the present invention, and preferred embodiments for fabricating a field effect type superconductive transistor using the structure of the present invention, will be explained in detail.

FIRST EMBODIMENT

In this embodiment, a method for providing a superconductive field effect type superconductive transistor (hereinafter referred to as STFT) on a surface (100) of a magnesia substrate, a light transmitting substrate, using the structure of the present invention is explained.

Although only one STFT is provided in the present embodiment, many STFTs may be fabricated at the same time by the same fabricating method if desired.

Figure 1B:
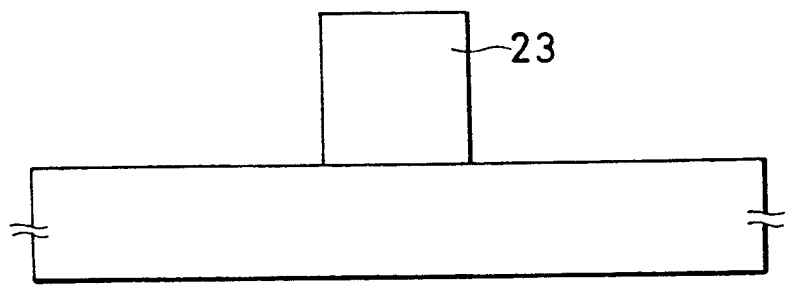
Figure 1C:
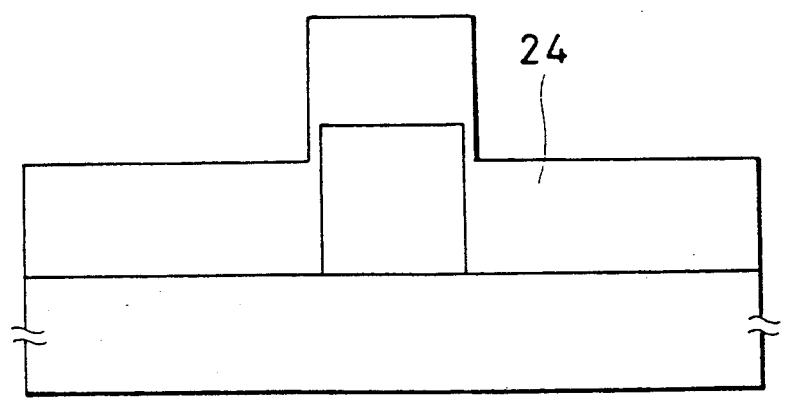
Figure 1D:
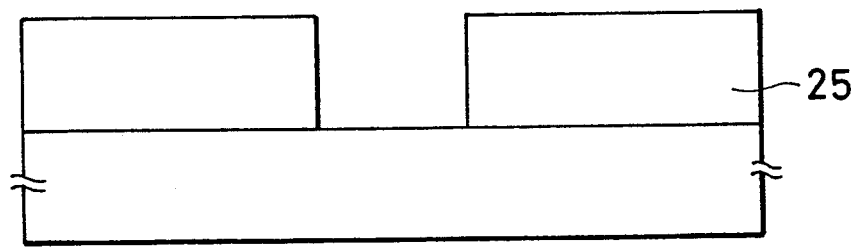
Figure 1E:
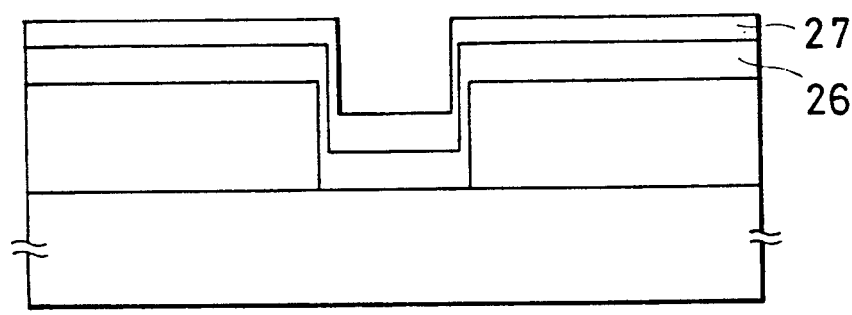
Figure 1F:
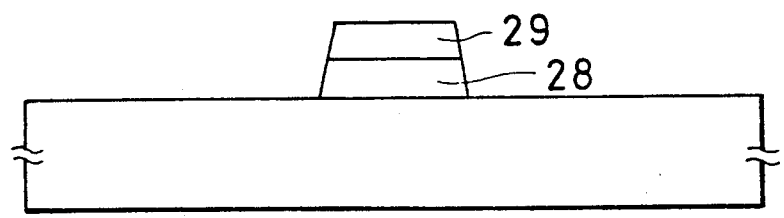
Figure 1G:
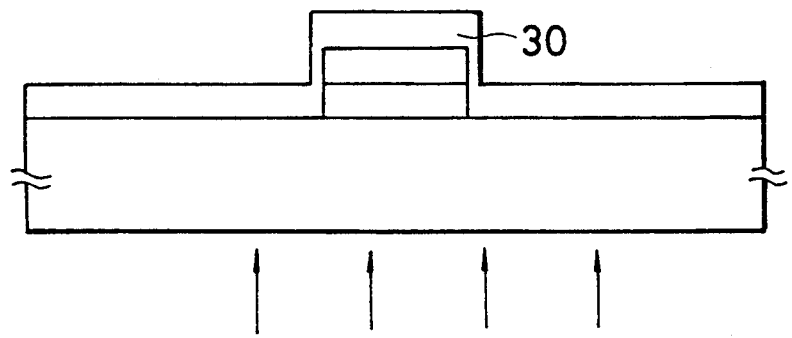
Figure 1H:
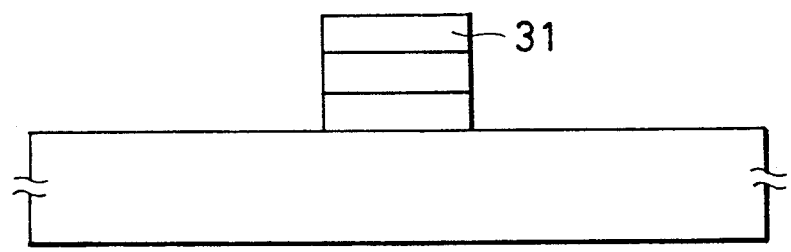
Figure 1I:
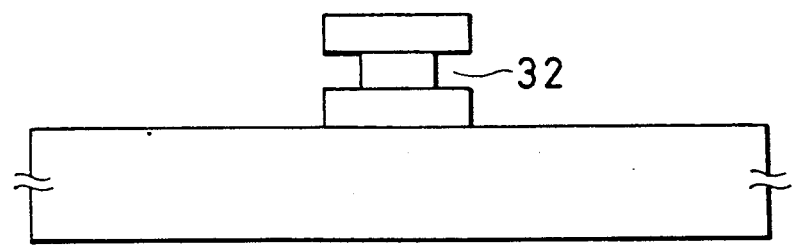
Figure 1J:
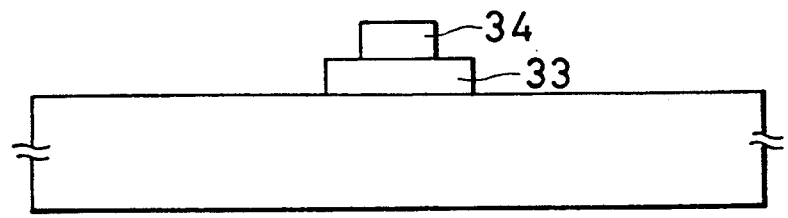
Figure 1K:
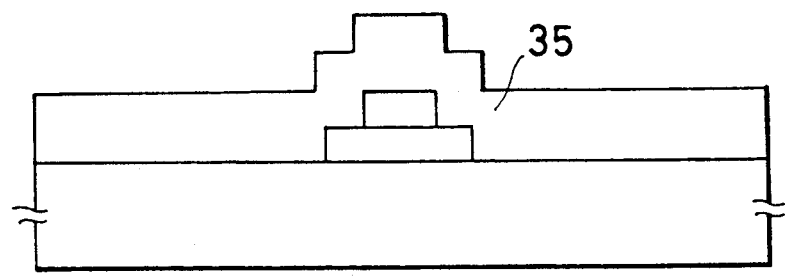
Figure 1L:
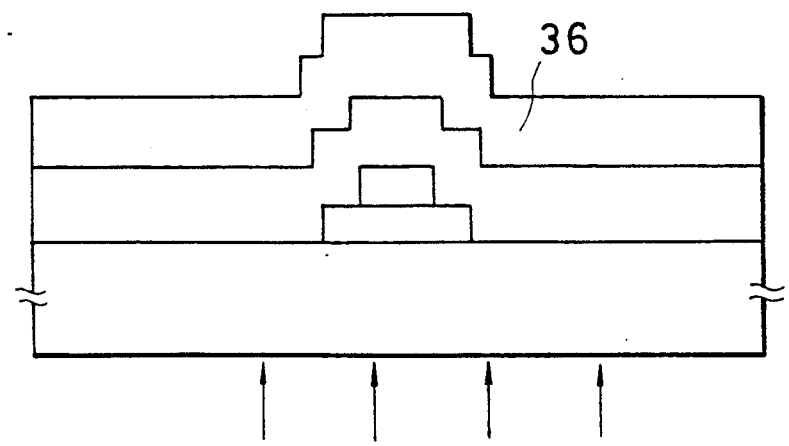
Figure 1:
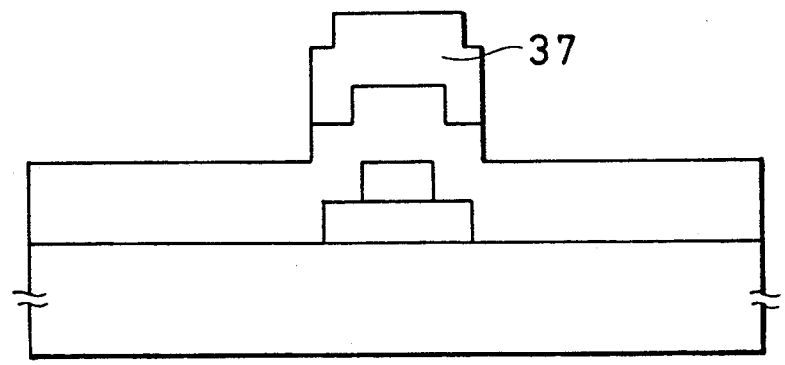
Figure 1:
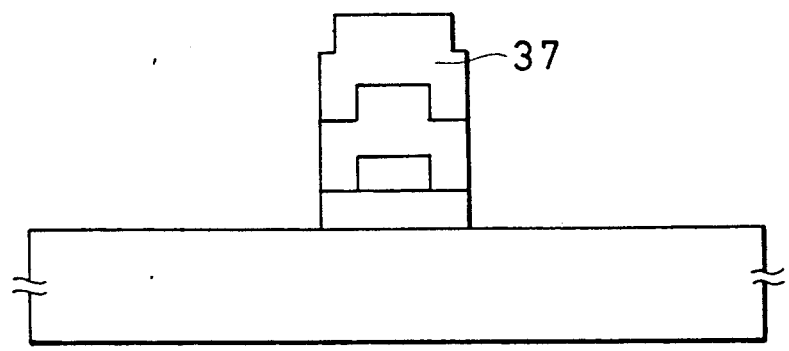
Figure 1:
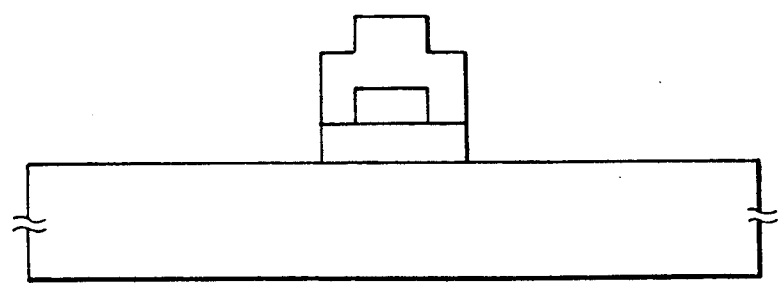
Figure 1:
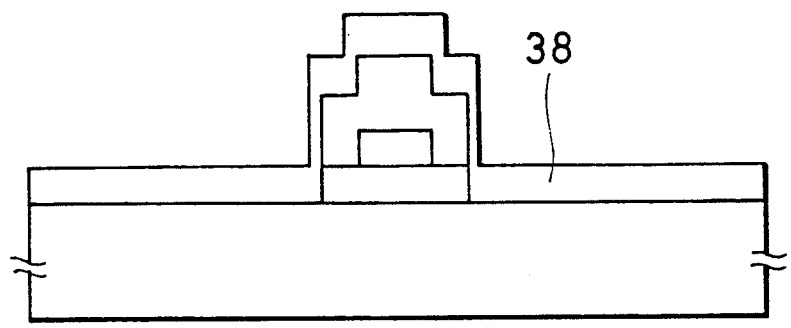
Figure 1:
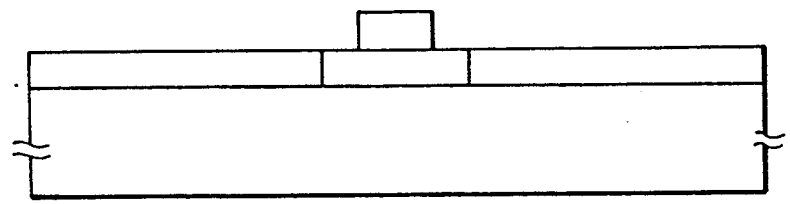

Referring now to FIG. 1, a fabricating process of the present embodiment will be explained.

In FIG. 1(A), a positive resist 22 is applied at first to the magnesia substrate 21 and is formed into a film having a thickness of 1000 A to 1 micrometer, preferably 3000 A to 5000 A, by a spin coating method. Then pre-baking is performed at 80° C. for 30 minutes. If desired, another light transmitting insulating substrate may be used other than the magnesia substrate.

Next a part which is to be a channel formation area is masked using a chromic oxide mask pattern, and is then exposed by a stepper using i-line to remove resist on the area other than the channel formation area as shown in FIG. 1(B). The width of the remaining resist 23, i.e. the channel length, is 0.4 micrometer. Although i-line is used in the present embodiment, g-line can be used effectively if the channel length is around half a micron. After the exposure, the remaining resist is post-baked at 100° C. for 30 minutes.

Then, a film 24 whose main component is carbon is formed on the non-light-transmitting insulating substrate and the resist to about 5000 A of thickness, using plasma CVD as shown in FIG. 1(C). That is, an amorphous film is formed by 10 to 50 W of power of 13.56 MHz high frequency or a semi-amorphous film by 50 to 200 W of power of the same using ethylene, $NF_3$ and hydrogen as starting materials in 50 Pa of reaction pressure.

At this time, a turbo molecular pump and a rotary pump are connected in series to a reaction furnace of a plasma CVD unit to prevent back-flow of gas into the reaction furnace and to suppress entrainment of oxygen as much as possible. It is also effective to provide a high vacuum discharge system such as a cryopump as a separate system from the aforementioned discharge system to lower oxygen concentration during formation of films.

The resist 23 is removed by soaking in a releasing fluid and giving ultrasonic vibrations and the carbonaceous film 24 accumulated on the resist 23 is removed by the lift-off. As a result, a carbonaceous film 25 is left so that it covers the area except for the channel formation area as shown in FIG. 1(D). The film 25 functions as a resist in the next high temperature process for fabricating the channel. That is, when a channel consisting of a strontium titanate film 26 is to be formed using MOCVD, substrate temperature has to be raised to 400° C. to 800° C., or 500° C. for example, in a process for forming the strontium titanate film 26 on the substrate epitaxially so that surface 100 appears on the surface of the crystal, and the film 25 is used as a mask since the current resist does not function as a mask at such high temperatures. Then, a film 27 composed of silver is formed on the strontium titanate 26 by vacuum evaporation to cause it to operate as a gate electrode as shown in FIG. 1(E).

Next, by annealing the entire structure in 600° C. of oxygen atmosphere, the structuring elements of the film 25 mainly composed of carbon are oxidized and evaporated as gas. Then, as a result of the second lift-off, a channel 28 and a gate electrode 29 can be formed as shown in FIG. 1(F).

After that, a positive resist 30 is applied and formed into a film with a thickness of 1000 A to 1 micrometer, preferably 3000 A to 5000 A, so that it covers the channel 28 and the gate electrode 29. A pre-baking process is carried out in the same manner as described before. An exposure process is carried out by irradiating i-line from the back of the substrate 21 as shown in FIG. 1(G), since a light transmitting substrate is used in the present embodiment. As a result, the part which is irradiated by i-line is removed and a protection film 31 can be provided above the gate electrode as shown in FIG. 1(H). This exposure process provides an advantage in that a mask alignment need not be carried out, since the gate electrode 29 acts as a mask. The resist is formed covering the gate electrode 29 as described above, because one of the most important points in structuring the gate is the ratio of sizes of the channel and the gate electrode. That is, when the size of the gate electrode is too large as compared to the size of the channel, part of the source current will flow into the gate, thereby undesirably affecting characteristics of the gate. In contrast, when the size of the gate electrode is too small as compared to the size of the channel, an insufficient electric field is produced, thereby also undesirably affecting device characteristics. In order to optimize this ratio, the channel or the gate electrode has to be etched selectively and only in the transverse direction, and the gate electrode is coated by the resist in the present embodiment to acid-etch the gate electrode only in the transverse direction. Although it is possible to form the gate electrode 29 thickly and to etch it without covering it by the resist, device sizes in the lamination direction cannot be made constant, so that the method provided in the present invention is considered to be better.

Then, while providing the resist 31 on the gate electrode as described above, the whole device is soaked into nitrate solution to selectively over-etch only the gate electrode 29 as shown in FIG. 1(I). Special care is necessary at this time since excessively long acid processing not only causes too much over-etching but also damages the channel area and other regions. Then, the resist is removed by a releasing fluid and the channel 33 and the gate electrode 34 can be completed as shown in FIG. 1(J).

Next, a film 35, mainly composed of carbon, is formed with a thickness of about 5000 A by plasma CVD so that it covers the channel 33 and the gate electrode 34 as shown in FIG. 1(K). Since film 35 must have a resistance to high temperature like that of film 24, an amorphous film was formed by 10 to 50 W of output of 13.56 MHz high frequency or 50 to 200 W of output of the same using ethylene, $NF_3$ and hydrogen as starting materials and in 50 Pa of reaction pressure.

Successively, a positive resist 36 is applied to the film 35 mainly composed of carbon and formed into a film with a thickness of 1000 A to 1 micrometer or preferably 3000 A to 5000 A. A pre-baking process is carried in the same manner as described before. An exposure process is carried out by irradiating g-line from the back of the substrate 21, since the light transmitting substrate is used in this embodiment, and the amorphous film and the semi-amorphous carbonacous film have a light transmitting property. Since a considerable amount of the light is absorbed by the substrate and the films mainly composed of carbon, such measures as increasing intensity of the light source and exposing for a long period of time are necessary. As a result, the part which is irradiated by g-line is removed and a protection film 37 can be formed on film 35 on the channel forming area as shown in FIG. 1(M). Although i-line steppers have been used in all the exposure processes except of this process, g-line is used in this exposure process since the film 35 has absorption edges tending toward short wavelengths.

Then, while providing the protection film 37, the whole body is selectively etched by $NF_3$ and the film 35 is removed except for that above the channel formation area. The structure shown in FIG. 1(N) results. Then the protection film 37 is removed by a releasing fluid to obtain the structure shown in FIG. 1(O).

To form the source and drain areas, a film 38 composed of an oxide superconductive material is formed with a thickness of about 1000 A at 500° C. of substrate temperature by molecular beam epitaxy assisted by active oxygen. This film forming method is selected because this method allows the lowest temperature epitaxial growth available in current technology. It is needless to say that such methods as MOCVD are industrially advantageous if the protection film 37 mainly composed of carbon is fabricated by a component which can sustain in higher temperature process, or the material of the protection film 37 is changed to a material having more heat resistance. The aforementioned oxide superconductive material has a perovskite structure and is composed of such materials as follows: $(A_{1-x}B_x)_yCu_zO_w$, where $x=0.1$ to $1.0$, $y=2.0$ to $4.0$, $z=1.0$ to $4.0$ and $w=4.0$ to $10.0$ and where A is composed of one or more elements selected from Y (yttrium), Gd (Gadolinium), Yb (ytterbium), Eu (europium), Tb (terbium), Dy (dysprosium), Ho (holmium), Er (erbium), Tm (thulium), Lu (lutetium), Sc (scandium) and other lanthanoids and B is composed of one or more elements selected from Ba (barium), Sr (strontium) and Ca (calcium). Although a material using Y as A and Ba as B has been selected and used in this embodiment, other materials may be used.

Then, by annealing the entire structure in an oxygen atmosphere at 600° C., the structuring elements of the protection film 37 mainly composed of carbon are evaporated as gas and as a result, the source, drain and gate are formed independently by the third lift-off.

The whole process is now completed for the fabrication of one element. When elements are to be integrated, an interlayer insulation is required, which can be implemented according to prior art technology.

Now operation results of the STFT obtained in the above process at the temperature of liquid nitrogen (77K.) will be described.

When an absolute value of voltage Vg applied to the gate electrode was about 0 to 50 mV, no superconductive current was confirmed between the source and drain, and when the voltage above that value was applied, a finite current Ic was observed. Especially when the absolute value of Vg exceeded about 100 mV, the leading edge of an I-V curve became sharp, and was considered to be practical. When the absolute value of Vg is about 100 mV, Ic was about 90 micro A, the switching speed was up to 10 ps and power consumption was on the order of up to micro W.

SECOND EMBODIMENT

In this embodiment, a method for providing a superconductive field effect type superconductive transistor (STFT) on a YSZ substrate, a non-transmitting substrate, using the structure of the present invention is explained. YSZ is selected because it is a material whose coefficient of thermal expansion is the closest to that of the oxide superconductive material. Although only one STFT is provided in the present embodiment, many STFTs may be fabricated at the same time by the same fabricating method.

Figure 2:
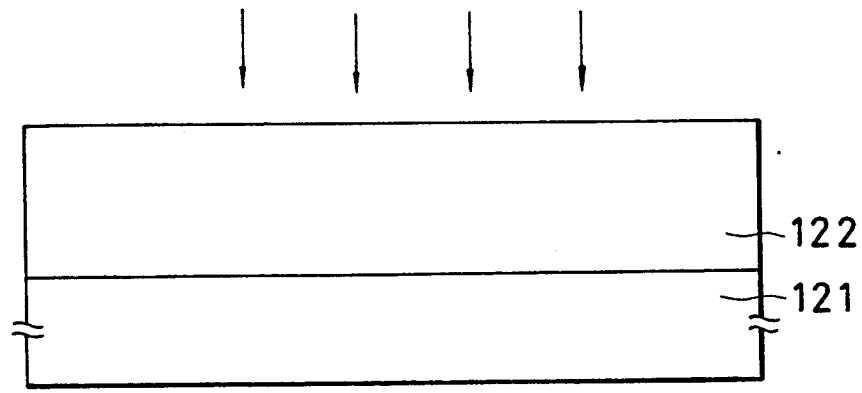
FIGS. 2(A) through (Q) illustrate an example of a method for fabricating STFT of the present invention using a non-transmitting substrate.
Figure 2:
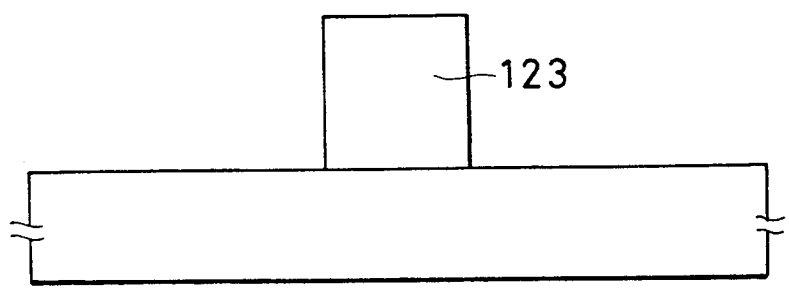
Figure 2:
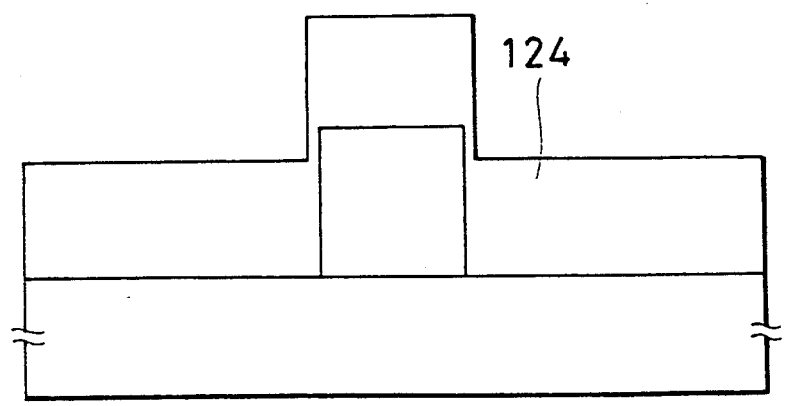
Figure 2:
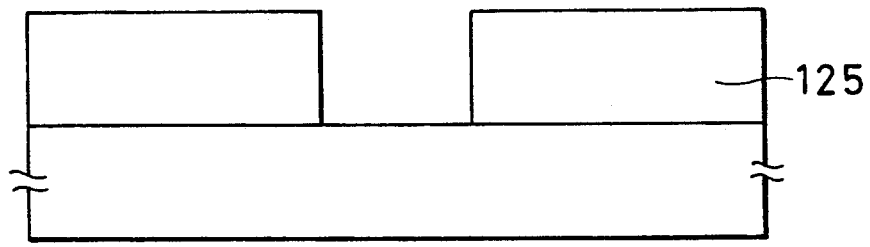
Figure 2:
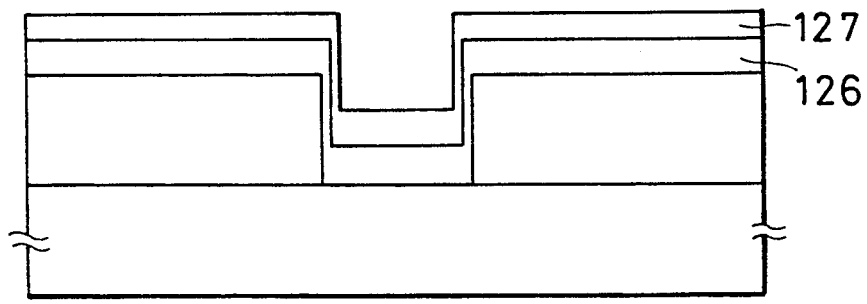
Figure 2:
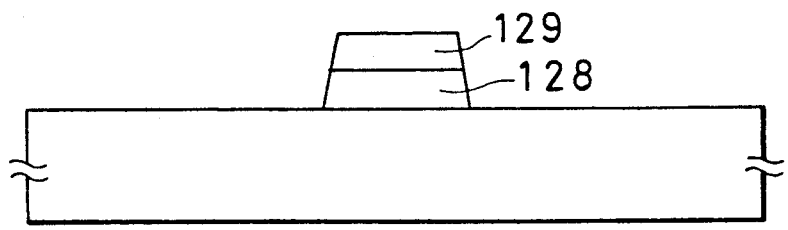

Referring now to FIG. 2, a fabricating process of this second embodiment will be explained.

In FIG. 2A, a positive resist 122 is applied at first to the YSZ substrate 121 and is formed into a film having a thickness of 1000 A to 1 micrometer, preferably 3000 A to 5000 A, by a dip coating method. Then pre-baking is carried out at 80° C. for 30 minutes. Another non-transmitting insulating substrate may be used other than the YSZ substrate, though the YSZ substrate is preferred for its coefficient of thermal expansion.

Next, a part which is to be a channel forming area is masked using a chromic oxide mask pattern, and is exposed by a stepper using g-line to remove resist on the area other than the channel forming area. The width of the remaining resist 123, i.e. the channel length, is 0.8 micrometer, which can be processed even by g-line. After the exposure, the remaining resist is post-baked at 100° C. for 30 minutes.

Then, a film 124 whose main component is carbon is formed on the non-transmitting insulating substrate and the resist to about 3000 A of thickness using plasma CVD as shown in FIG. 2(C). That is, an amorphous film is formed by 10 to 50 W of power of 13.56 MHz high frequency or a semi-amorphous film by 50 to 200 W of power of the same using ethylene, NF$_3$ and hydrogen as starting materials in 50 Pa of reaction pressure.

At this time, a turbo molecular pump and a rotary pump are connected in series to a reaction furnace of a plasma CVD unit to prevent back-flow of gas into the reaction furnace and to suppress entrainment of oxygen as much as possible. It is also effective to provide a high vacuum discharge system such as a cryopump as a separate system from the aforementioned discharge system to lower oxygen concentration during formation of films.

Then, resist 123 is removed by soaking in a releasing fluid and applying ultrasonic vibrations, and the film mainly composed of carbon accumulated on the resist 123 is removed by the lift-off process at the same time. As a result, a film 125 mainly composed of carbon is left so that it covers the part other than the channel forming area as shown in FIG. 2(D). The film 125 functions as if it is a resist in the next high temperature process for fabricating the channel, as in the first embodiment. That is, when a channel forming layer 126 composed of La$_2$CuO$_4$, which is a parent material of the oxide superconductive material, is formed using MOCVD, substrate temperature has to be raised to 400° C. to 800° C., or 450° C. for example, in a process for forming the channel formation layer 126 on the substrate epitaxially so that it orients in the c-axis direction. The film 125 mainly composed of carbon is used as a mask since the current resist does not function as a mask at such high temperatures. Then, a film 127 composed of chromium is formed on the channel forming layer 126 composed of La$_2$CuO$_4$ by sputtering, to cause it to operate as a gate electrode as shown in FIG. 2(E).

Next, by annealing the entire structure in 600° C. of oxygen atmosphere, the structuring elements of the film 125 are oxidized and evaporated as gas. Then by the second lift-off, a channel 128 and a gate electrode 129 can be formed as shown in FIG. 2(F).

Figure 2G:
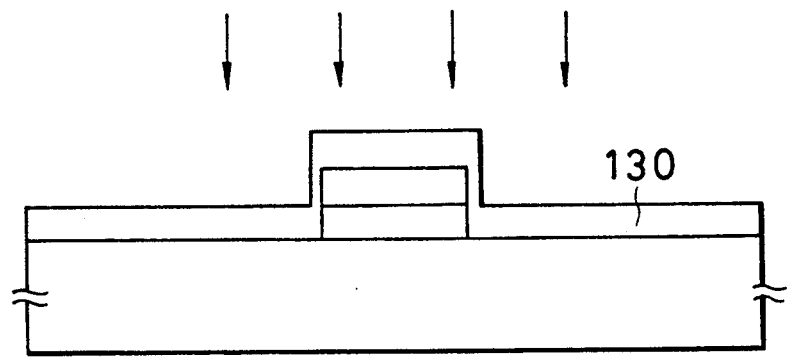
Figure 2H:
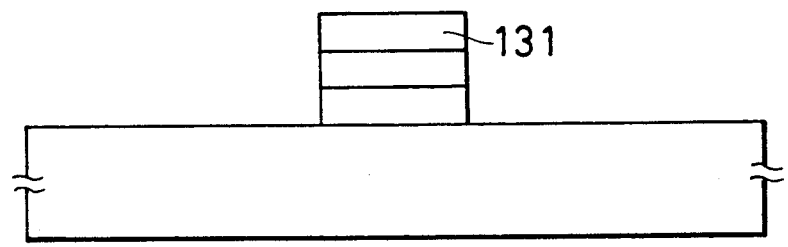
Figure 2I:
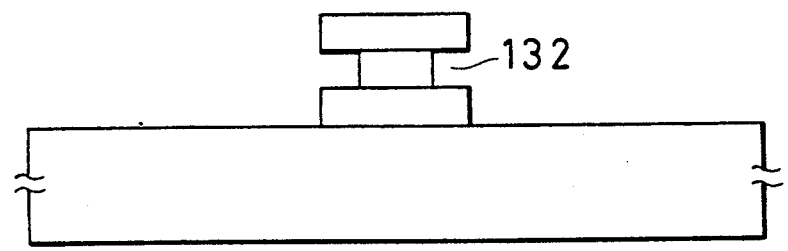

After that, a positive resist 130 is applied and formed into a film with a thickness of 1000 A to 1 micrometer, preferably 3000 A to 5000 A, so that it covers the channel 128 and the gate electrode 129 as shown in FIG. 2(G). A pre-baking process is carried out thereafter in the same manner described previously. An exposure process is carried out by irradiating g-line from the above the substrate 121 through the mask, since a non-transmitting substrate is used in the present embodiment. As a result, the part which is irradiated by g-line is removed, and a protection film 131 can be provided above the gate electrode as shown in FIG. 2(H). The resist is formed covering the gate electrode 29 as described above, because as noted previously, one of the most important points in structuring the gate is the ratio of sizes of the channel and the gate electrode. That is, when the size of the gate electrode is too large as compared to the size of the channel, part of the source current flows into the gate, thereby adversely affecting characteristics of the gate. In contrast, when the size of the gate electrode is too small compared to the size of the channel, an insufficient electric field results, adversely affecting characteristics of the device. In order to optimize this ratio, the channel or the gate electrode has to be etched selectively, and only in the transverse direction, and the gate electrode is coated by the resist in the present embodiment to acid-etch the gate electrode only in the transverse direction. Although it is possible to form the gate electrode 129 thickly and to etch it without covering it by the resist, device sizes in the lamination direction cannot be made constant, so that the method provided by the present invention is preferred.

Figure 2J:
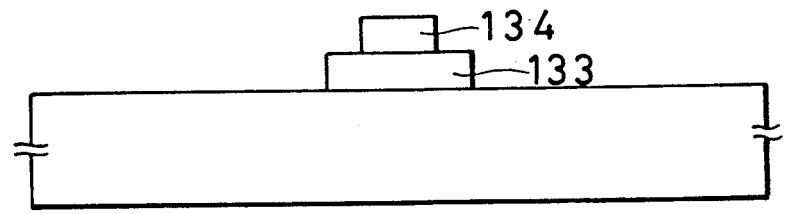

Then, while providing the resist 131 on the gate electrode 129 as described above, the entire structure is soaked into chromic mixed acid solution to selectively over-etch only the gate electrode 129. Special care is necessary in this step since excessively long acid processing not only causes too much over-etching but also damages the channel area and other regions. Then, the resist is removed by a releasing fluid and the channel 133 and the gate electrode 134 can be completed as shown in FIG. 2(J).

Figure 2K:
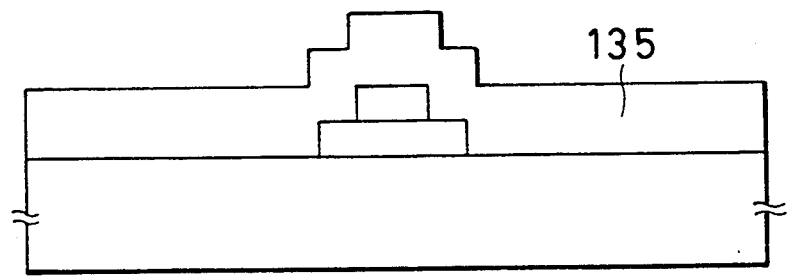

Then, a film 135 mainly composed of carbon is formed into a film with a thickness of about 5000 A by plasma CVD so that it covers the channel 133 and the gate electrode 134 as shown in FIG. 2(K). Since this film has to have a resistance to high temperature like the previously described film 124, an amorphous film was formed by 10 to 50 W of output of 13.56 MHz high frequency, or a semi-amorphous film by 50 to 200 W of output of the same, using ethylene, $NF_3$ and hydrogen as starting materials and in 50 Pa of reaction pressure.

Figure 2L:
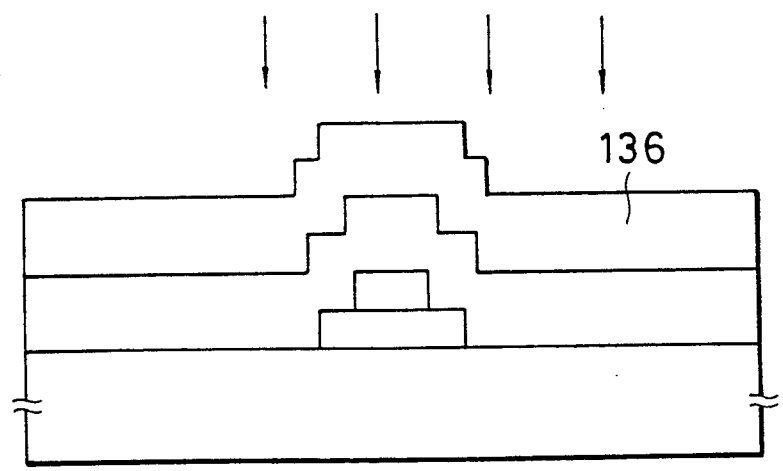
Figure 2:
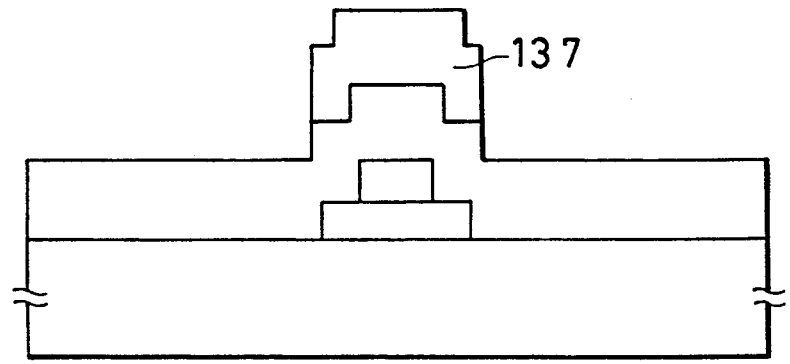
Figure 2:
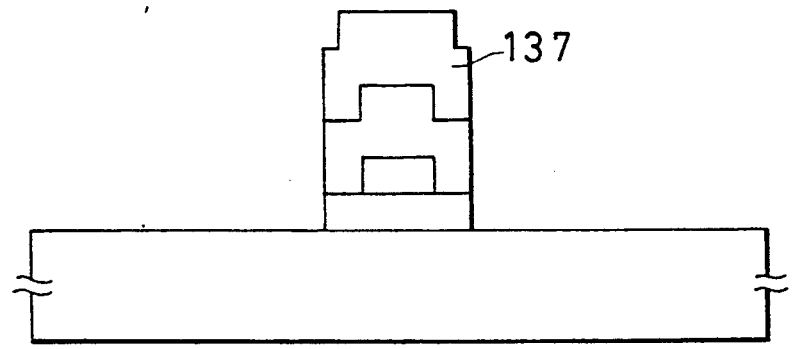
Figure 2:
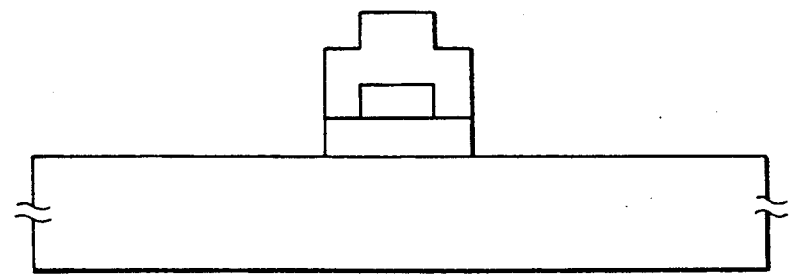
Figure 2:
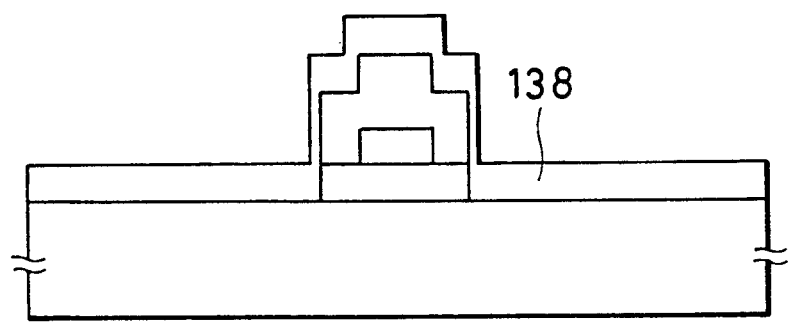
Figure 2:
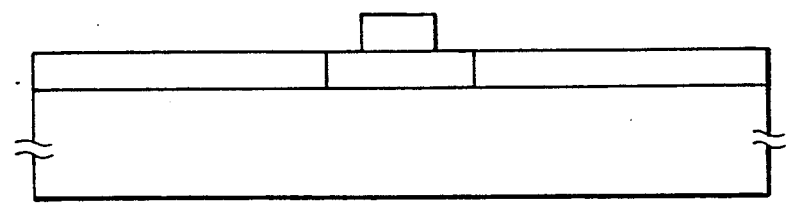

Successively, a positive resist 136 is applied to the film 135 and formed into a film with a thickness to 1000 A to 1 micrometer, preferably 3000 A to 5000 A, as shown in FIG. 2(L). A pre-baking process is carried out thereafter in the same manner as described before. An exposure process is carried out by irradiating g-line from the above the substrate 121 through the mask since the non-transmitting substrate is used in this embodiment. As a result, the part which is irradiated by g-line is removed and a protection film 137 is formed on the film mainly composed of carbon on the channel forming area as shown in FIG. 2(M).

Then, while providing the protection film 137, the whole body is selectively etched by $NF_3$ and the film mainly composed of carbon is removed, except in the channel forming area. The structure shown in FIG. 2(N) results. Then the protection film 137 is removed by a releasing fluid to obtain the structure shown in FIG. 2(O).

In order to form the source and drain areas, a film 138 composed of the oxide superconductive material is formed into a film with a thickness of about 500 A at 500° C. of substrate temperature by molecular beam epitaxy assisted by active oxygen as shown in FIG. 2(P). This film forming method is selected because this method allow the lowest temperature epitaxial growth available in current technology. Of course, MOCVD is industrially advantageous if the protection film 137 mainly composed of carbon is fabricated in a manner to sustain higher temperature processes, or the material of the protection film 137 is changed to a material having more heat resistance. The aforementioned oxide superconductive material has a perovskite structure and is composed of such materials as follows: $(A_{1-x}B_x)yCuzOw$, where $x=0.1$ to 1.0, $y=2.0$ to 4.0, $z=1.0$ to 4.0 and $w=4.0$ to 10.0 and where A is composed of one or more elements selected from Y (yttrium), Gd (Gadolinium), Yb (ytterbium), Eu (europium), Tb (terbium), Dy (dysprosium), Ho (holmium), Er (erbium), Tm (thulium), Lu (lutetium), Sc (scandium) and other lanthanoids and B is composed of one or more elements selected from Ba (barium), Sr (strontium) and Ca (calcium). Although a material using Ho as A and Ba as B has been selected and used in this embodiment, other materials may be used as a matter of course.

Then, by annealing the whole in an oxygen atmosphere at 600° C., the structuring elements of the protection film 137 mainly composed of carbon are evaporated as gas and as a result, the source, drain and gate are formed independently by the third lift-off.

The whole process has now been disclosed for the formation of one element. When integrated elements are to be formed, an interlayer separation is implemented in a conventional manner.

Now operational results of the STFT obtained in the above process at the temperature of liquid nitrogen (77K) will be described.

When an absolute value of voltage Vg applied to the gate electrode was between 0 and 70 mV, no superconductive current was confirmed between the source and drain. When a voltage above 70 mV was applied, a finite current Ic was observed. Especially when the absolute value of Vg exceeded about 120 mV, the leading edge of an I-V curve became sharp and it was considered practical. When the absolute value of Vg was about 120 mV, Ic was about 110 micro A, the switching speed was up to 10 ps and power consumption was on the order of up to micro W.

THIRD EMBODIMENT

In this embodiment, a substrate having a surface 100 of strontium titanate, a light transmitting substrate, is used and the same strontium titanate surface 100 is used for a channel of a gate.

An oxide superconductive material has a perovskite structure and is composed of such materials as follows: $(A_{1-x}B_x)yCuzOw$, where $x=0.1$ to 1.0, $y=2.0$ to 4.0, $z=1.0$ to 4.0 and $w=4.0$ to 10.0 and where A is composed of one or more elements selected from Y (yttrium), Gd (Gadolinum), Yb (ytterbium), Eu (europium), Tb (terbium), Dy (dysprosium), Ho (holmium), Er (erbium), Tm (thulium), Lu (lutetium), Sc (scandium) and other lanthanoids and B is composed of one or more elements selected from Ba (barium), Sr (strontium) and Ca (calcium). A material using Y as A and Ba as B is selected and used in this embodiment.

Although the material mainly composed of carbon has been used (as an interlayer insulating film) instead of resists in the high temperature process in the first and second embodiments, beryllium fluoride is used in this embodiment. This material sublimates at about 800° C. in normal state, and a process for removing it is carried out by raising the temperature to more than about 750° C. in a reduced pressure condition. In this case, however, in order to improve characteristics of the source and drain composed of the oxide superconductive materials, final annealing has to be carried out in oxygen. The other processes are carried out in the same manner as in the first embodiment. The channel length is 25 micrometers, silver is used for the gate electrode, and an electron beam lithograph technique is used.

When an absolute value of voltage Vg applied to the gate electrode was about 0 to 30 mV, no superconductive current was confirmed between the source and drain, and when a voltage above that range was applied, a finite current Ic was observed. Especially when the absolute value of Vg exceeded about 50 mV, the leading edge of an I-V curve became sharp and was considered to be practical. When the absolute value of Vg was about 50 mv, Ic was about 60 micro A, the switching speed was up to 10 ps, and power consumption was on the order of up to micro W.

As described above, the implementation of the structure of the present invention comprising the steps of selectively etching the gate electrode, leaving the filler around the gate electrode by sensitizing from above or back of the substrate and forming the gate electrode, source and drain electrodes and the source and drain areas using the filler, allows reduction in the number of mask alignments and assures high reliability as compared to prior art methods. The development of the aforementioned process now permits practical construction of a superconductive field effect transistor with practical characteristics.

Figure 3:
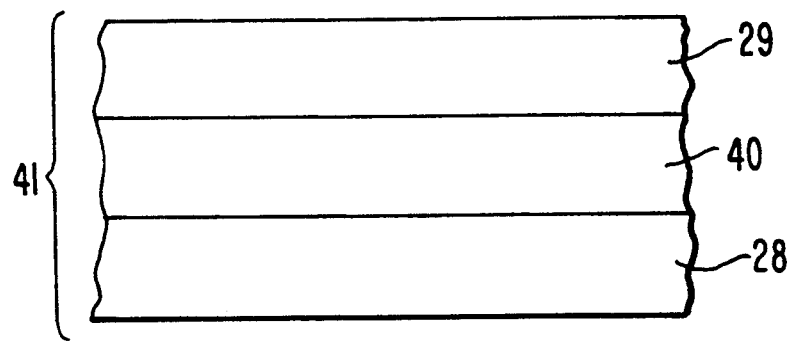
FIG. 3 shows a three-layered lamination layer useful in the present invention, including a non-superconductive channel forming layer, an insulating layer, and a conductor layer for forming a gate electrode.

FIG. 3 shows a lamination layer 41 having a gate insulating layer, which can be used in the present invention. As described previously, and as shown in FIG. 3, the lamination layer may consist of a non-superconductor layer 28 which will become a channel region, an insulating film layer 40 which will become a gate insulating film, and a conductor layer 29 which will become the gate electrode.

EMBODIMENT 4

A method for fabricating a superconductive thin film transistor utilizing oxide superconductive materials, comprises several steps.

A lamination layer 41 is formed on a non-transmitting insulating substrate in an island shape. As shown in FIG. 3, the lamination layer includes a non-superconducting layer with a perovskite structure 28, an insulating film layer 40, and a conductor layer 29.

Sides of the conductor layer 29 are selectively etched to form etched portions. An interlayer separating film is deposited, a positive resist is applied on the interlayer separating film, the upper part of the lamination layer 41 is masked, and the positive resist is sensitized. The interlayer separating film is left around the conductor layer 29, which will become a gate electrode, by removing the sensitized positive resist and selectively etching the interlayer separating film. A film composed of an oxide superconductive material is formed to produce source and drain regions.

Portions of the oxide superconductive film formed on the interlayer separating film are removed, by removing the interlayer separating film left at the etched portions of the conductor layer 29, to define source and drain regions.

The interlayer separating film may be composed of a material which has a melting point or sublimating point above a substrate temperature in a process for forming a film composed of an oxide superconductive material. The interlayer separating film may be one which can be evaporated by heat annealing at 600° to 1000° C., or one which can be dissolved and removed by treating with water or an organic solvent after the process.

EMBODIMENT 5

A method for fabricating a superconductive thin film transistor utilizing oxide superconductive materials comprises several steps.

A lamination layer is formed on a light transmitting insulating substrate in an island shape. The lamination layer includes a non-superconducting layer 28 with a perovskite structure, an insulating film layer 40, and a conductor layer 29 as shown in FIG. 3.

Sides of the conductor layer 29 are selectively etched, and a carbon-based interlayer separating film is deposited on the front of the substrate. A positive resist is applied on the interlayer separating film. The positive resist is then irradiated with light from the back of the substrate to sensitize the positive resist, using the channel forming area of the lamination layer (non-superconducting layer 28) as a mask. Irradiated portions of the positive resist are removed and the interlayer separating film is selectively etched to leave the interlayer separating film around the conductor layer. The conductor layer 29 becomes a gate electrode and non-superconducting layer 28 becomes a channel region of the device.

What is claimed is:

1. A method of fabricating a superconductive thin film transistor comprising the steps of:
    forming a channel layer comprising a non-superconductive material having a perovskite structure on a substrate; and
    forming source and drain regions comprising an oxide superconducting material on said substrate so that said channel layer contracts and intervenes between said source and drain regions, wherein a-b planes of said oxide superconducting material are substantially aligned with a surface of said substrate.

2. The method of claim 1 wherein said non-superconducting material comprises a material selected from the group consisting of strontium titanate and $La_2CuO_4$.

3. The method of claim 1 wherein said substrate comprises a material selected from the group consisting of alumina, YSZ, $M_gO$, zirconia, yttria, $SrTiO_3$ and glass.

4. The method of claim 1 further comprising the steps of forming a gate electrode on said channel layer with a gate insulating therebetween.

5. A method for fabricating a superconductive thin film transistor utilizing oxide superconductive materials, comprising the steps of:
    providing a non-light-transmitting insulating substrate;
    forming a lamination layer on said substrate in an island shape, said lamination layer including a non-superconducting layer with a perovskite structure, an insulating film layer, and a conductor layer;
    selectively etching sides of said conductor layer to form etched portions of said conductor layer;
    depositing an interlayer separating film;
    applying a positive resist on said interlayer separating film;
    removing a selected portion of said positive resist and selectively etching said interlayer separating film, to leave said interlayer separating film around said conductor layer;
    forming a film composed of an oxide superconductive material to produce source and drain regions;
    removing portions of said oxide superconductive film formed on said interlayer separating film, by moving said interlayer separating film left at the etched portions of said conductor layer, to define said source and drain regions, said non-superconducting layer forming the channel region of the thin film transistor and said conductor layer forming the gate electrode of the thin film transistor.

6. The method of claim 5 wherein said interlayer separating film is composed of a material which has a melting point or sublimating point above a substrate temperature in a process for forming a film composed of an oxide superconductive material and which can be evaporated by heat annealing in 600° to 1000° C. after forming said oxide superconductive film.

7. The method of claim 5 wherein said interlayer separating film is composed of a material which has a melting point or sublimating point above a substrate temperature in a process for forming a film composed of any oxide superconductive material and which can be dissolved and removed by treating by a solvent after formation of said oxide superconductive film.

8. A method for fabricating a superconductive thin film transistor utilizing oxide superconductive materials, comprising the steps of:

providing a light-transmitting insulating substrate with front and back sides;

forming a lamination layer on the front of said substrate in an island shape, said lamination layer including a non-superconducting layer with a perovskite structure, an insulating film layer, and a conductor layer;

selectively etching sides of said conductor layer to form etched portions of said conductor layer;

depositing a carbon-based interlayer separating film on the front of said substrate;

applying a positive resist on said interlayer separating film;

irradiating light from the back of said substrate to sensitize said positive resist;

removing irradiated portions of the positive resist and selectively etching said interlayer separating film to leave said interlayer separating film around said conductor layer;

forming a film composed of an oxide superconductive material to produce source and drain regions;

removing portions of said oxide superconductive film formed on said interlayer separating film, by removing said interlayer separating film left at the etched portions of said conductor layer, to define said source and drain regions, said non-superconducting layer forming the channel region of the thin film transistor and said conductor layer forming the gate electrode of the thin film transistor.

* * * * *